United States Patent
Biebuyck et al.

[19]

[11] Patent Number: 5,895,228

[45] Date of Patent: Apr. 20, 1999

[54] ENCAPSULATION OF ORGANIC LIGHT EMITTING DEVICES USING SILOXANE OR SILOXANE DERIVATIVES

[75] Inventors: Hans Biebuyck, Thalwil; Eliav Haskal, Zurich, both of Switzerland

[73] Assignee: International Business Machines Corporation, Armonk, N.Y.

[21] Appl. No.: 08/821,218

[22] Filed: Mar. 20, 1997

Related U.S. Application Data

[62] Division of application No. 08/749,101, Nov. 14, 1996, Pat. No. 5,734,225.

[51] Int. Cl.⁶ .................................................. H01L 51/40
[52] U.S. Cl. .............................. 438/99; 438/15; 438/26; 438/127
[58] Field of Search ........................ 438/15, 26, 29, 438/99, 127, 763

[56] References Cited

U.S. PATENT DOCUMENTS

| | | | |
|---|---|---|---|
| 3,170,813 | 2/1965 | Duncan et al. | 438/763 |
| 3,584,264 | 6/1971 | McLouski et al. | 438/763 |
| 3,694,902 | 10/1972 | Apgar et al. | 438/26 |
| 3,754,986 | 8/1973 | Perez-Albuerne | 438/99 |
| 3,780,357 | 12/1973 | Haitz | 438/26 |
| 3,860,740 | 1/1975 | Watkins | 438/26 |
| 3,991,461 | 11/1976 | Anderson | 438/15 |
| 4,327,369 | 4/1982 | Kaplan | 438/127 |
| 4,505,029 | 3/1985 | Owyang et al. | 438/615 |
| 4,990,464 | 2/1991 | Baumgart et al. | 438/763 |
| 5,213,864 | 5/1993 | Wong . | |
| 5,482,896 | 1/1996 | Tang | 438/99 |
| 5,516,727 | 5/1996 | Broom | 438/26 |

*Primary Examiner*—Kevin M. Picardat
*Assistant Examiner*—Deven Collins
*Attorney, Agent, or Firm*—Ohlandt, Greeley, Ruggiero & Perle

[57] ABSTRACT

An organic light emitting device (10) is provided which is encapsulated by a Siloxane buffer layer (17.1). This Siloxane buffer layer (17.1) is applied to the diode (10) providing for protection against contamination, degradation, oxidation and the like. The Siloxane buffer layer (17.1) carries at least a second encapsulation layer (17.2).

7 Claims, 4 Drawing Sheets

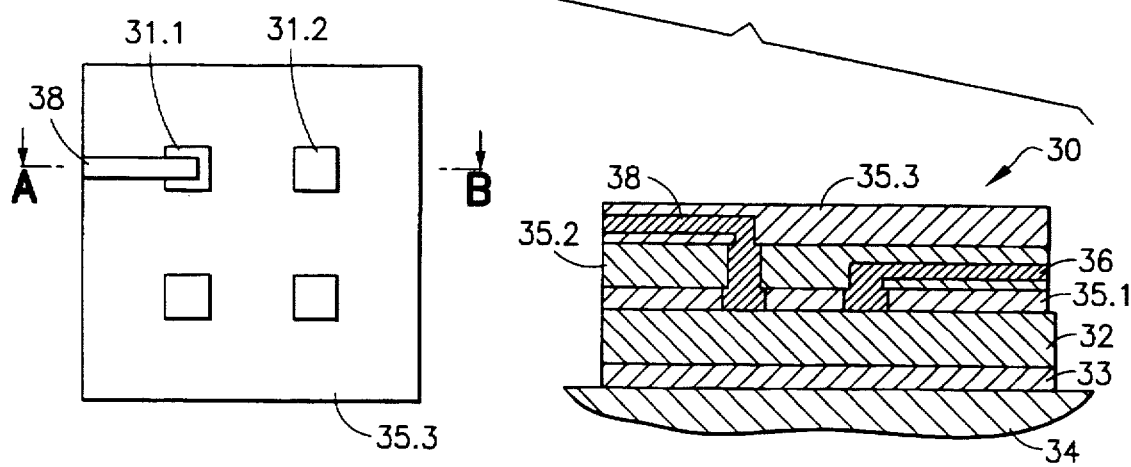
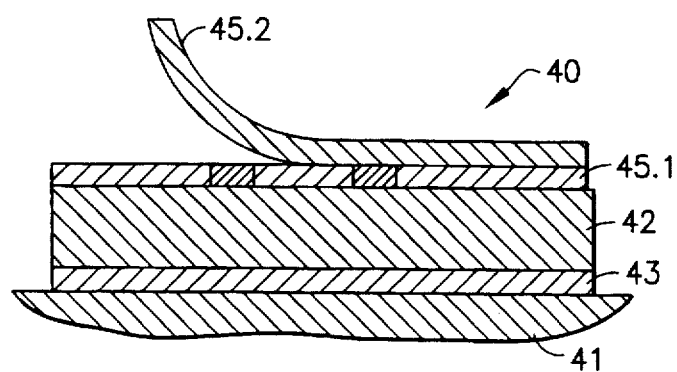

ENCAPSULATION OF ORGANIC LIGHT EMITTING DEVICES USING SILOXANE OR SILOXANE DERIVATIVES

This is a divisional of application Ser. No. 08/749,101 filed on Nov. 14, 1996 now U.S. Pat. No. 5,734,225.

TECHNICAL FIELD

The present invention pertains to organic electroluminescent devices, such as discrete light emitting devices, arrays, displays, and in particular to the encapsulation of these devices. It furthermore relates to a method for encapsulating the same.

BACKGROUND OF THE INVENTION

Organic electroluminescence (EL) has been studied extensively because of its possible applications in discrete light emitting devices, arrays and displays. Organic materials investigated so far can potentially replace conventional inorganic materials in many applications and enable wholly new applications. The ease of fabrication and extremely high degrees of freedom in organic EL device synthesis promises even more efficient and durable materials in the near future which can capitalize on further improvements in device architecture.

Organic EL light emitting devices (OLEDs) function much like inorganic LEDs. Depending on the actual design, light is either extracted through a transparent electrode deposited on a transparent glass substrate, or through a transparent top electrode. The first OLEDs were very simple in that they comprised only a two to three layers. Recent development led to organic light emitting devices having many different layers (known as multilayer devices) each of which being optimized for a specific task.

With such multilayer device architectures now employed, a performance limitation of OLEDs is the reliability. It has been demonstrated that some of the organic materials are very sensitive to contamination, oxidation and humidity. Furthermore, most of the metals used as contact electrodes for OLEDs are susceptible to corrosion in air or other oxygen containing environments. A Ca cathode, for example, survives intact only a short time in air, leading to rapid device degradation. It is also likely that such highly reactive metals undergo a chemical reaction with the nearby organic materials which also could have negative effects on device performance. A low work function cathode metal approach requires careful handling of the device to avoid contamination of the cathode metal, and immediate, high quality encapsulation of the device if operation in a normal atmosphere is desired. Even well encapsulated low work function metal contacts are subject to degradation resulting from naturally evolved gases, impurities, solvents from the organic LED materials.

Many approaches have been attempted in order to solve the problem of electrode instability and degradation. A common approach is the use of a low work function metal subsequently buried under a thicker metal coating. In this case, pinholes in the metal still provide ample pathways for oxygen and water to reach the reactive metal below, as is described in Y. Sato et al., "Stability of organic electroluminescent diodes", Molecular Crystals and Liquid Crystals, Vol. 253, 1994, pp. 143–150, for example.

The overall lifetime of current organic light emitting devices is limited. The lack of inert, stable, and transparent encapsulants for stable OLED operation remains a major obstacle to OLED development. The problem with most encapsulants is that they require an aggressive solvent. Such solvents have been found to attack organics and reactive metals used for organic light emitting devices.

Organic LEDs have great potential to outperform conventional inorganic LEDs in many applications. One important advantage of OLEDs and devices based thereon is the price since they can be deposited on large, inexpensive glass substrates, or a wide range of other inexpensive transparent, semitransparent or even opaque crystalline or non-crystalline substrates at low temperature, rather than on expensive crystalline substrates of limited area at comparatively higher growth temperatures (as is the case for inorganic LEDs). The substrates may even be flexible enabling pliant OLEDs and new types of displays. To date, the performance of OLEDs and devices based thereon is inferior to inorganic ones for several reasons:

1. High operating current: Organic devices require more current to transport the required charge to the active region (emission layer) which in turn lowers the power efficiency of such devices.
2. Reliability: Organic LEDs degrade in air and during operation. Several problems are known to contribute.
   A) Efficient low field electron injection requires low work function cathode metals like Mg, Ca, Li etc. which are all highly reactive in oxygen and water. Ambient gases and impurities coming out of the organic materials degrade the contacts.
   B) Conventional AgMg and ITO contacts still have a significant barrier to carrier injection in preferred ETL and HTL materials, respectively. Therefore, a high electric field is needed to produce significant injection current.
3. Poor chemical stability: Organic materials commonly used in OLEDs are vulnerable to degradation caused by the ambient atmosphere, diffusion of contact electrode material, interdiffusion of organics, and reactions of organics with electrode materials.

As can be seen from the above description there is a need for simple and efficient encapsulation of organic light emitting devices. It is a further problem of light emitting devices in general, that a light path for emission of the light generated is to be provided. In addition, metal patterns are required for contacting the light emitting element of an organic light emitting array or display.

It is an object of the present invention to provide a simple and cheap encapsulation of organic light emitting devices.

It is a further object of the present invention to provide new and improved organic EL devices, arrays and displays based thereon with improved stability and reliability.

It is a further object to provide a method for making the present new and improved organic EL devices, arrays and displays.

SUMMARY OF THE INVENTION

The invention as claimed is intended to improve the reliability of known organic light emitting devices. The above objects have been accomplished by providing an encapsulation for an organic light emitting device which comprises a transparent Siloxane or Siloxane derivatives buffer layer, on top of which at least another encapsulation layer is formed. The Siloxane or Siloxane derivative buffer is in direct contact with the device it encapsulates partially, or completely.

It has been realized that most encapsulants require the use of reactive and aggressive solvents or components which, when being brought into contact with organic devices, have a detrimental impact on the reliability and lifetime of these devices. The Siloxane or Siloxane derivative buffer layer passivates the organic surface and serves as a buffer for chemicals used during subsequent processing steps. On top of this buffer layer, either a single encapsulation layer, or a stack of several layers may be situated. These additional layers may either be formed directly on top of the buffer layer, or part of these layer may be formed separately before being applied.

One of the layers on top of the buffer layer, or several of these layers, may comprise metallization patterns. In order to be able to contact the light emitting devices protected by said buffer layer, vias or holes have to be provided. By means of these holes, a small portion of the contact electrode of an encapsulated device is laid bare. The metallization pattern may thus be brought into contact with the respective contact electrode. The Siloxane buffer layer may either be patterned appropriately when being formed, or it may be patterned after it was deposited or formed.

The present invention allows to realize structures comprising a stack of several metallization layers.

The present invention builds on the finding that Siloxanes and Siloxane derivatives are well suited for use in direct contact with the organic materials and contact material used for making organic light emitting devices. This is in contrast to currently accepted OLED technology, where no material is allowed to come into direct contact with the organic device. Current OLEDs are protected by 'mechanical' sealing, e.g. using an appropriate housing and sealing means.

In contrast to conventional approaches, the encapsulant is even allowed to cover the light emitting portion(s), or part thereof. It turned out that Siloxanes and Siloxane derivatives do not seem to have a detrimental impact on the behavior and lifetime of the light emitting portion of organic devices.

The Siloxanes and Siloxane derivative buffer layer forms a transparent and non-reactive seal which makes conformal contact with the organic devices. It provides for an excellent barrier to external contamination, such as water, solvent, dust and the like. The proposed encapsulant also protects against corrosion of the highly reactive metal electrodes (e.g. calcium, magnesium, lithium) used in OLED devices. It is non-conductive, which is of particular importance in case that metal electrodes are also embedded in the encapsulant on top of the buffer layer.

Furthermore, Siloxane and Siloxane derivatives are extremely robust and stable. They are unlikely to react with the organic devices even in high-driving, high-heating conditions. Even close to the light emitting portion(s) of OLEDs, where usually the power density has its maximum, no reaction with the present encapsulant takes place. Siloxane is also able to withstand the temperatures caused by currents in the metallization patterns or like those encountered in the deposition of metals by resistive heating or sputtering methods.

It is another important feature of Siloxane and Siloxane derivatives that it forms a conformal contact with the underlying organic material such that no air, solvent, or water is trapped. Due to this, the lifetime of the organic device is extended.

Further advantages of the encapsulation scheme comprising a Siloxane and Siloxane derivative buffer will be addressed in connection with the embodiments of the present invention.

DESCRIPTION OF THE DRAWINGS

The invention is described in detail below with reference to the following schematic drawings (it is to be noted that the drawings are not drawn to scale):

FIGS. 3A–D illustrates the fabrication of a multi-layer encapsulation on top of an organic light emitting array or display, according to the present invention.

FIG. 4 illustrates how one layer of a stack of encapsulation layers can be rolled onto a Siloxane buffer layer, according to the present invention.

GENERAL DESCRIPTION

Figure 1:
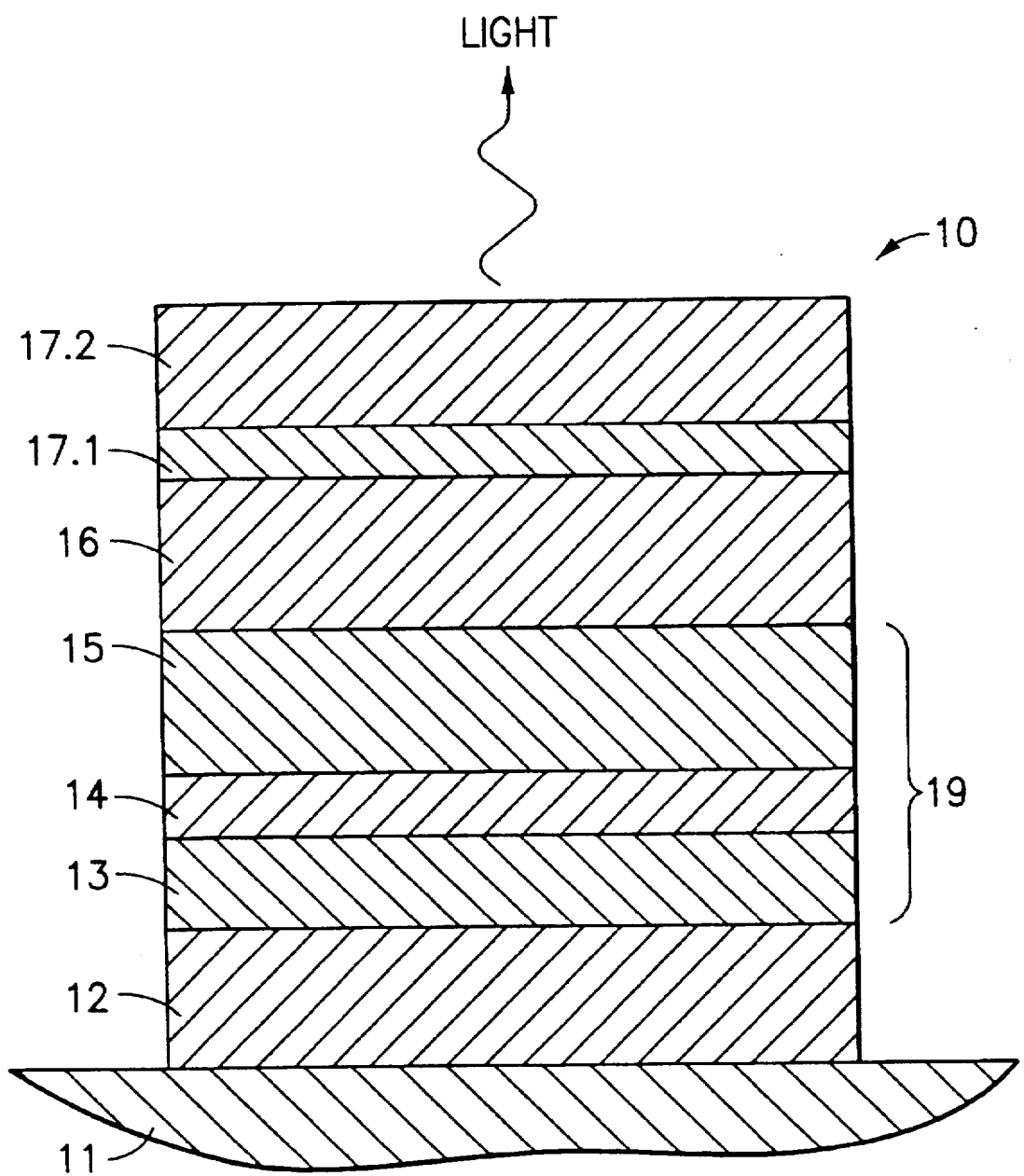
FIG. 1 shows a schematic cross-section of a discrete organic light emitting device being protected by a Siloxane or Siloxane buffer layer being part of a stack of encapsulation layers, according to the present invention.

Silicone molding compounds have been known for more than twenty years and their uses include, among others, the encapsulation of electrical and electronic devices. In particular Siloxane, a silicone resin is widely used for the molding of electronic devices, such as integrated circuits, and the coating of portions of such devices. Typical examples of Siloxanes are composed of copolymers or blends of copolymers of any combination of monophenyisiloxane units, diphenylsiloxane units, phenylmethylsiloxane units, dimethylsiloxane units, monomethylsiloxane units, vinylsiloxane units, phenylvinylsiloxane units, methylvinylsiloxane units, ethylsiloxane units, phenylethylsiloxane units, ethylmethylsiloxane units, ethylvinylsiloxane units, or diethylsiloxane units.

Depending on the resin composition, the properties of Siloxane can be altered. Some aspects to be taken into account are: stability against crack formation, moisture resistance, coefficient of thermal expansion, elastic modulus and crosslinking methods. Siloxanes that cross link by the hydrosiliation reaction provide a particularly useful subset of Siloxane. Siloxanes allowing crosslinking on their exposure to light, are also preferred as when the Siloxane prepolymer contains vinyl or acetylenic groups and a light activated radical initiator, for example.

Examples of Siloxanes and Siloxane derivatives suited as encapsulants for organic light emitting devices are those given in U.S. Pat. Nos. 4,125,510, 4,405,208, 4,701,482, 4,847,120, 5,063,102 and 5,213,864, 5,260,398, 5,300,591, and 5,420,213, for example. It is important to chose a Siloxane which is transparent in the wavelength range of the light emitted by the OLED to be encapsulated. In the following, the word Siloxane is used as a synonym for all different kinds of transparent Siloxanes. Other materials can be cured with the Siloxane to further enhance a material property. Thus mixtures of two polymers can provide enhancement of the device performance as when one component of the encapsulant contains an oxygen scavenger like an organoplatinum complex or Titanium, or a free radical scavenger like tert butanol or some similar molecule. According to the present invention, the Siloxane buffer layer is employed, which provides a useful passivation for transfer of additional layers, such as a polymer layer, especially where the latter requires an aggressive solvent that would otherwise attack the device, but is effectively blocked by the Siloxane buffer. These additional layers can further improve performance by preventing passive or active diffusion of gases through to the OLED.

The Siloxane can be applied from solution or as an already cured solid. Suited for encapsulation with Siloxane are: spin-on or spreading techniques, or a simple immersion. Likewise, the Siloxane can be cured first and then rolled onto the device. If the Siloxane is not fully cured, it remains slightly tacky and thereby perfectly sticks to the device surface. This is of particular importance if the surface is uneven, or if it consists of different sections and materials. If the Siloxane is still tacky, additional layers can be easily applied on top. This could also be used to hold an additional glass plate on top, which, together with the Siloxane buffer layer, perfectly protects the organic device. In order to improve the adhesion, the layers forming the encapsulation can be pressed against the organic device using a stamp, for example. It is to be noted that the word 'adhesion' is used as synonym for any kind of forces or interaction leading to an intimate contact between two layers without requiring mechanical means to hold the two layers in place.

In order to avoid contamination of the organic stack of the OLED to be encapsulated, or to prevent metal electrodes from corrosion, it turned out to be important to have an encapsulant which makes conformal contact with the devices. Furthermore, it is important that the OLED can be encapsulated without having to heat the OLED or without having to treat it with aggressive chemicals.

Siloxane and Siloxane derivatives can be molded into shapes that can be put on the OLED easily. Due to the elastic properties of Siloxane, the Siloxane buffer layer easily conforms to the OLED surface. It is possible, to roll a pre-fabricated Siloxane buffer layer onto the OLED. It is an interesting property of Siloxane, that several layers of Siloxane can be stacked on each other, as will be described later. Siloxanes are particularly well suited to molding on the micron or submicron scales forming stable patterns (structures) with high aspect ratio and facile release properties.

Instead of putting a pre-fabricated Siloxane buffer layer onto the OLED, one may likewise cover the OLED with a viscous Siloxane composition that can be cured using ultraviolet radiation in order to form a Siloxane buffer layer, according to the present invention. Details are given in U.S. Pat. No. 5,063,102. If a curable Siloxane composition is used, excessive heating of the OLED is avoided when forming the buffer layer.

A first embodiment of the present invention is illustrated in FIG. 1. A discrete organic light emitting device 10 is shown. It comprises an electrode 12 (cathode) situated on a substrate 11. On top of the electrode 12 a stack of three organic layers 13–15 is situated. The organic layer 13 serves as electron transport layer (ETL) and the organic layer 15 serves as hole transport layer (HTL). The organic layer 14 which is embedded between the two transport layers 13 and 15 serves as electroluminescent layer (EL). In the following, the stack of organic layers will be referred to as organic region, for sake of simplicity. In the present embodiment, the organic region carries the reference number 19. On top of the HTL 15, a top electrode (anode) 16 is formed. The uppermost surface of the device 10 is sealed by a Siloxane buffer layer 17.1. This buffer layer 17.1 conforms to the device 10. In the present example, the encapsulation stack comprises a second layer 17.2, which is formed on top of the buffer layer 17.1. A Siloxane buffer layer may also be used to cover and protect cathode-up structures.

It is to be noted that the different layers forming the encapsulation stack may have different refractive indices. This is useful if one wants to improve or alter the optical radiation characteristic of the overall device.

Figure 2:
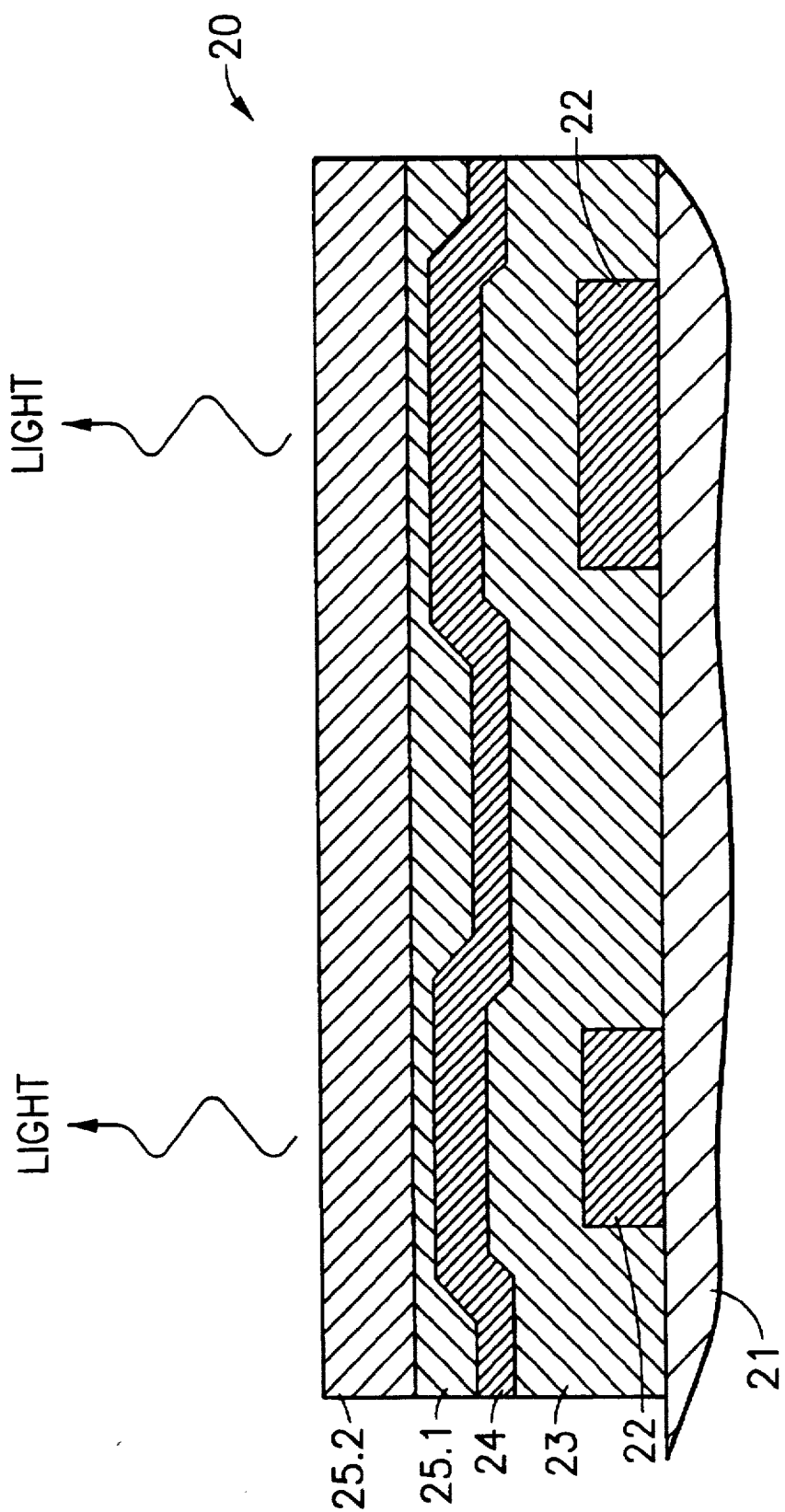
FIG. 2 shows a cross-section of a display or array, according to the present invention, comprising two encapsulation layers, the first one being a Siloxane buffer layer.

A second embodiment is illustrated in FIG. 2. In this Figure, a cross-section of an organic light emitting array 20 is shown. On top of a common substrate 21, cathodes 22 are patterned such that each of the light emitting diodes of the array 20 can be individually addressed. For sake of simplicity, the organic light emitting diodes are depicted as a dark grey layer 23. The layer 23 may comprise a stack of organic layers, for example. On top of the organic layer 23, a transparent or semi-transparent anode 24 is formed. In order to planarize the array 20, a curable Siloxane encapsulant is poured over the top of the array to form a buffer layer 25.1. By exposure of the Siloxane to ultraviolet light, the Siloxane buffer layer 25.1 is cured. This buffer layer 25.1 encapsulates the array 20, passivates it, and provides for a planarized top surface.

In a next step, another Siloxane layer 25.2 is applied. This Siloxane layer 25.2 may for example be rolled onto the array 20. The Siloxane layer 25.2 and the Siloxane buffer layer 25.1 adhere to each other. In the present arrangement, the size of each of the diodes of the array 30 is mainly defined by the shape of the cathodes 32.

In the following, the process for encapsulating an organic display device 30, according to the present invention, is addressed. The relevant steps are illustrated in FIGS. 3A through 3D. On the left hand side of these Figures a top view of the display device 30 is given. The respective cross-sectional view (from A to B) is illustrated on the right hand side.

Figure 3A:
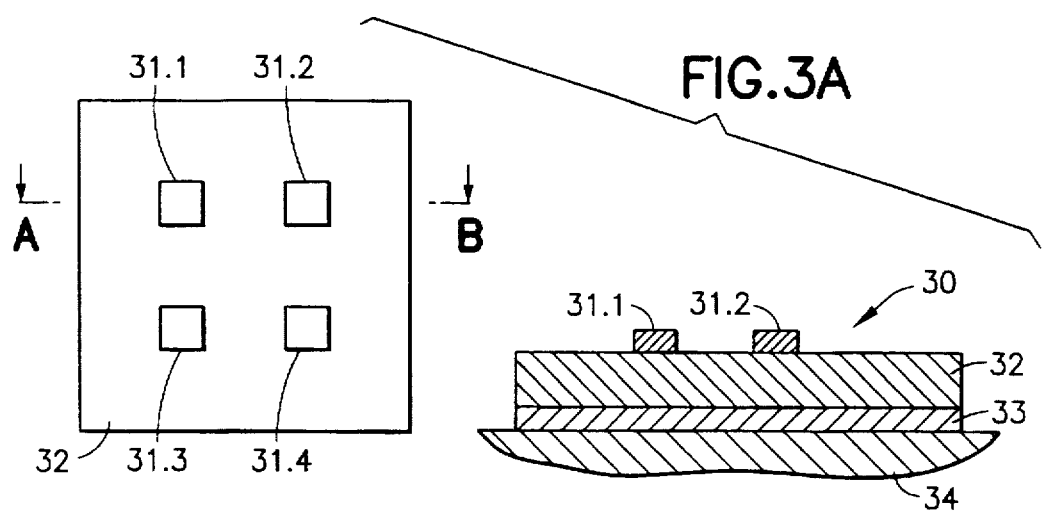

As shown in FIG. 3A, the display device 30 comprises four independent top electrodes 31.1–31.4 and one common bottom electrode 33. The organic stack actually making up the organic light emitting display are illustrated a dark grey layer 32, for sake of simplicity. In the present embodiment, the whole device 30 is formed on a common substrate 34, which may be flexible, for example.

Figure 3B:
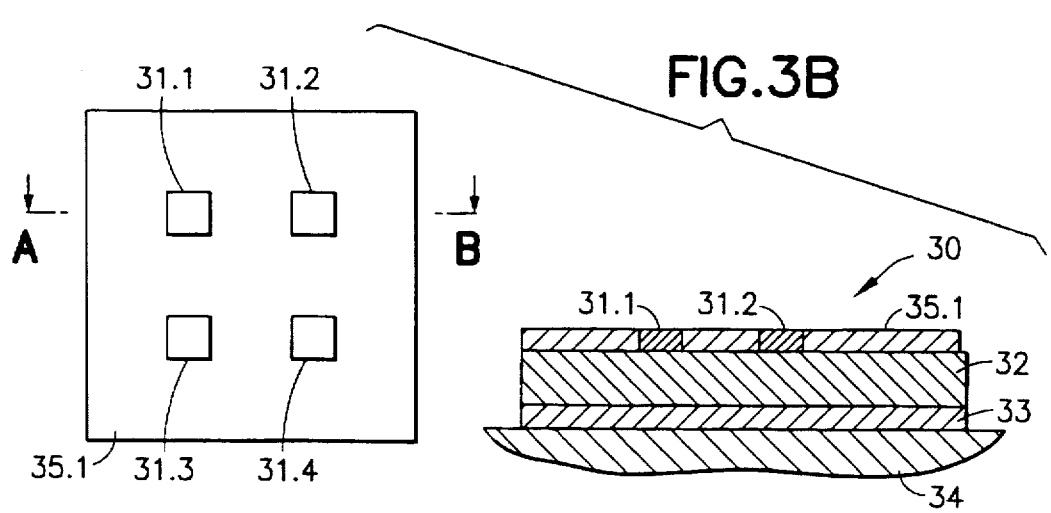

In a first step, the portion of the organic stack 32 which is exposed to 'air' is covered with a Siloxane buffer layer 35.1. In the present example, this buffer layer 35.1 is formed such that the top electrodes 31.1–31.2 are not covered, as illustrated in FIG. 3B. This can be easily done by pouring a curable Siloxane encapsulant over the device 30 until the whole device, except for the electrodes 31.1 and 31.2, are covered. Then the Siloxane may be cured using a UV lamp, for example.

Figure 3C:
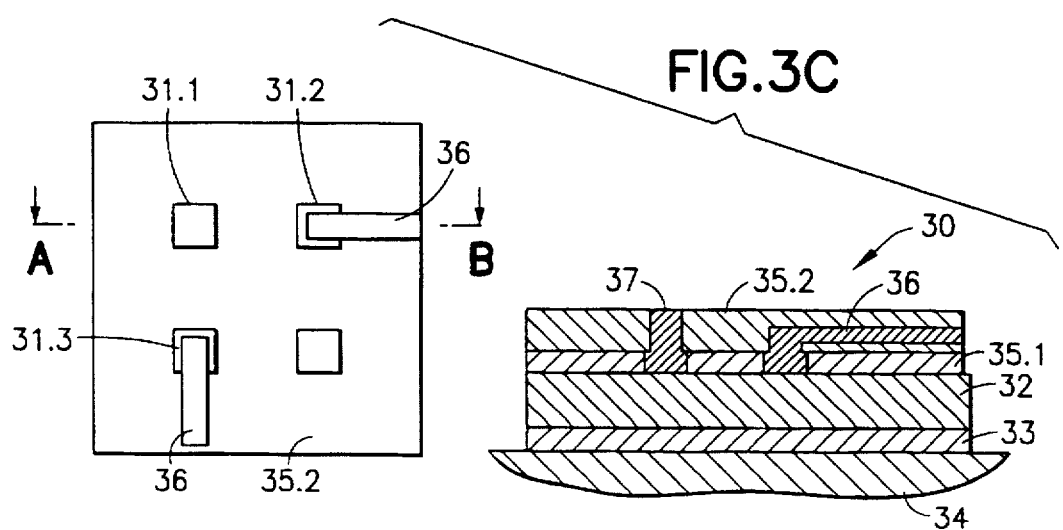

In a subsequent step, the Siloxane buffer layer 35.1 is hidden under a second encapsulation layer 35.2. As shown in FIG. 3C, this second layer 35.2 comprises a metallization pattern which allows to contact the electrodes underneath. Two metal lines 36 are embedded in the second layer 35.2 such that contact is made to the electrodes 31.2 and 31.3. In addition, the second layer 35.2 comprises a via 37 filled with a conductive material. This via leads through the second layer 35.2 and allows to contact the electrode 31.1.

In a final step, illustrated in FIG. 3D, a third encapsulation layer 35.3 is applied. This layer 35.3 comprises a metal line 38 contacting the via 37 and electrode 31.1.

By means of a stack of encapsulation layers formed on top of the Siloxane buffer layer, complex wiring schemes can be realized. This is very important for various display applications.

It is advantageous, if the encapsulation stack consists of Siloxane layers, because these layers adhere to each other. On top of that, Siloxane is well suited to carry even complex metallization patterns. The respective metal lines, pads, vias and the like can easily be embedded in Siloxane.

In FIG. 4, it is illustrated how an encapsulation layer 45.2 can be rolled onto the Siloxane buffer layer 45.1. The adhesion of the two layers 45.1 and 45.2 depends on the materials chosen and conditions under which the second layer 45.2 is rolled onto the buffer layer 45.1. The adhesion can be improved, if required, by pressing the second layer 45.2 onto the buffer layer 45.1, for example. Likewise, the buffer layer 45.1 may be treated before application of the second layer 45.2 such that its surface becomes tacky. According to the present invention, no photolithographic steps with undesired chemicals are needed. In certain cases, photolithography can not be avoided for the structuring of one of the encapsulation layers. In such a case, the Siloxane buffer layer protects the organic device underneath from the aggressive chemical photolithographic steps that may compromise the device.

A Siloxane layer can be easily mass-fabricated. The respective fabrication steps can be carried out independently without having a detrimental effect on the more complicated OLED device.

Depending on the composition and thickness of the Siloxane used, a flexible encapsulant can be obtained. Such a flexible encapsulant can be applied to organic light emitting devices being formed on a flexible substrate. It is possible, for instance, to realize flexible organic displays being protected by a flexible encapsulant.

To summarize, the above exemplary embodiments are fully compatible with any kind of organic light emitting devices, including polymeric, oligomeric, and small molecule OLED designs, or any hybrid design thereof.

We claim:

1. Method for encapsulating an organic light emitting device by a transparent or semi-transparent stack of encapsulation layers, comprising the steps of:

applying a buffer layer which comprises Siloxane to said organic light emitting device such that said buffer layer is in conformal contact with said organic light emitting device, and attaching a second layer to said buffer layer such that
it adheres to said buffer layer and
is separated from said organic light emitting device by said buffer layer.

2. The method of claim 1, whereby, said buffer layer is applied to said organic light emitting device carrying out the steps:

covering organic light emitting device with curable Siloxane, and then curing it on said organic light emitting device, preferably curing it such that it remains tacky.

3. The method of claim 1, whereby said buffer layer is applied to said organic light emitting device in form of a flexible Siloxane film which was fabricated separately.

4. The method of claim 2, whereby said buffer layer is patterned when applying it such that at least one contact electrode of said organic light emitting device remains accessible.

5. The method of claim 3, whereby said buffer layer is structured after having been applied to said organic light emitting device such that at least one contact electrode of said organic light emitting device remains accessible.

6. The method of claim 1, whereby said stack of encapsulation layers is pressed onto said organic light emitting device.

7. The method of claim 1, whereby one of the layers of said stack of encapsulation layers is structured after having been applied to said organic light emitting device.

* * * * *